United States Patent
Messager

(10) Patent No.: US 6,483,729 B2
(45) Date of Patent: Nov. 19, 2002

(54) SLAVED SUPPLY FOR SERIAL LINK, OF MASTER SLAVE TYPE

(75) Inventor: Philippe Messager, Nantes (FR)

(73) Assignee: Atmel Nantes S.A. (FR)

( * ) Notice: Subject to any disclaimer, the term of this patent is extended or adjusted under 35 U.S.C. 154(b) by 0 days.

(21) Appl. No.: 10/071,612

(22) Filed: Feb. 8, 2002

(65) Prior Publication Data

US 2002/0112086 A1 Aug. 15, 2002

(30) Foreign Application Priority Data

Feb. 9, 2001 (FR) .............................. 01 01822

(51) Int. Cl.[7] .............................................. H05B 37/02
(52) U.S. Cl. ........................................ 363/72; 363/131
(58) Field of Search .......................... 363/72, 71, 131

(56) References Cited

U.S. PATENT DOCUMENTS

| | | | | |
|---|---|---|---|---|
| 5,097,183 A | * | 3/1992 | Vila-Masot et al. | 315/209 R |
| 5,289,176 A | * | 2/1994 | Novakovich et al. | 340/3.51 |
| 5,313,143 A | * | 5/1994 | Vila-Mascot | 315/209 R |
| 5,490,117 A | | 2/1996 | Enzo et al. | 365/226 |
| 5,623,224 A | | 4/1997 | Yamasa et al. | 327/333 |
| 5,929,616 A | | 7/1999 | Perraud et al. | 323/274 |
| 6,345,187 B1 | * | 2/2002 | Berthoud et al. | 455/415 |
| 6,346,798 B1 | * | 2/2002 | Passoni et al. | 323/272 |

* cited by examiner

*Primary Examiner*—Bao Vu
(74) *Attorney, Agent, or Firm*—Piper Rudnick; Michael L. Kenaga

(57) ABSTRACT

The invention relates to a slaved supply for slave element tied by a serial link to a master element.

The slaved supply comprises a slave module for regulating the supply voltage comprising a module (1) for sampling and for detecting the peak value of the master digital output signals delivering a sampled peak value of the master output signals and a module (2) for slaving the slave supply voltage to a value substantially equal to that of the sampled peak value of the master output signals. The slave output signals delivered exhibit a peak amplitude matched to that of the master output signals.

Application to the supply of master slave circuits in mobile or fixed telephony.

3 Claims, 5 Drawing Sheets

SLAVED SUPPLY FOR SERIAL LINK, OF MASTER SLAVE TYPE

FIELD OF THE INVENTION

The present invention relates to slaved supply for serial link, of master/slave type.

BACKGROUND OF THE INVENTION

Information technologies are currently exhibiting a burgeoning mode of communication between users.

Although present-day telecommunication networks allow the transmission of digital data under continually improved conditions, both as regards the bit rate and the security of transmission, the communication interfaces between the user and the machine, communication terminal, are still subject to hardware contingencies with regard to reliability, to security and the integrity of the digital data transmitted.

Such is the case in particular as regards the serial type links with which terminals playing the role of master element are equipped as are the electronic circuits of so-called peripheral elements, such as microprocessor cards, playing the role of slave element, and inserted by users into a card reader driven by the master element.

In particular, in this type of situation, the transferring of digital data from the master element to the slave element or vice-versa remains subservient, in particular, to the plurality of ohmic contacts between pins of the microprocessor card, and furthermore to the supply voltage levels applied to the master, respectively slave element.

By way of non-limiting example, the electrical diagram of the input/output buffer circuit of a mobile or non-mobile telephone supplied by a master supply circuit and the electrical diagram of a slave input/output buffer circuit, consisting of a microprocessor subscriber card for example, are supplied from a master supply voltage Vdcm, respectively from a slave supply voltage Vdce and are connected by a serial link SL.

The electrical supply to the aforesaid master and slave buffer circuits is achieved from a reference voltage Vref, delivered by a "bandgap" type circuit, which delivers a fixed voltage. This type of circuit is represented in FIG. 1a.

When the slave buffer circuit, the card, has to talk to the telephone, by way of the serial link SL, the telephone, playing the role of the master element, wakes up the slave buffer circuit by sending wake-up pulses. The amplitude level of these pulses is 1.8 volts, for example.

The master input/output buffer circuit is supplied from the master supply voltage Vdcm, by way of an active multiplier circuit, receiving the reference voltage Vref, a differential amplifier OPA whose positive input terminal is linked to this reference voltage forming a set-point value, a regulating transistor, playing the role of variable resistor voltage-controlled by the output of the differential amplifier OPA. This regulating transistor is connected between the master supply voltage Vdcm and a master regulated supply voltage output point, a smoothing capacitor connected between the output point of the master regulated supply voltage and the earth voltage of the device of the master element and a divider point $R_1$, $R_2$ linking the output point of the master regulated supply voltage to the negative input of the differential amplifier. For a given ratio of resistances $R_1$, $R_2$, an output value of master regulated supply voltage which is lower than the value of the master supply voltage Vdcm but greater than the value of the reference voltage Vref is obtained at equilibrium.

Typically, for a reference voltage Vref=1.25 volts, an output value of regulated supply voltage of 1.8 volts supplying the master input/output buffer circuit is obtained.

Under the normal operating conditions, in the presence of good ohmic contacts, provided however that the master reference voltage VREF and the slave reference voltage Vref, the master and slave resistances $R_1$ respectively $R_2$ are equal and hence that the peak value of the master digital output signals is identical to the slave regulated supply voltage, such a mode of operation guarantees master respectively slave digital input/output signals of substantially the same peak value and the same amplitude.

However, by reason of an inbalance in the equilibrium of the voltage ratios VREF/Vref and of the master and slave resistances $R_1$ or $R_2$, the aforesaid normal conditions are not always obtained, thereby giving rise to a degradation of the peak value and of the amplitude of the digital input/output signals of the master, respectively slave buffer circuits. Furthermore, when the master respectively slave supply voltage values are distinct and different, the risk of mismatch of the amplitude of the digital input/output signals of the aforesaid buffer circuits is increased, a risk of increased consumption and of destruction of the slave supply circuits through the so-called "latch-up start" phenomenon corresponding to a latching of inrush current liable to destroy the bipolar transistors. These risks are illustrated in FIG. 1b.

SUMMARY OF THE INVENTION

The object of the present invention is to remedy the aforesaid drawbacks of the circuits of the prior art, through the implementation of a circuit for regulating the supply of a slave element linked to a master element by a serial link, this regulating circuit making it possible to slave the slaved regulated slave supply voltage to the peak value of the master digital output signals, thereby making it possible to eliminate any risk of degradation or of destruction of the slave circuits and moreover to adapt automatically to any type of telephone 1.8 V; 2.7 V; 3.3 V without changing the slave circuit.

Another object of the present invention is also, on account of the aforesaid slaving of the slave regulated supply voltage to the peak value of the master digital output signals, the implementation of a slave regulated supply circuit of substantially simplified structure, in which any reference voltage generator of "bandgap" type is eliminated.

The slaved supply for linking a slave element linked to a master element by a serial link that is the subject of the present invention is formed by a master element comprising a master module for regulating the electrical supply voltage of a master output circuit delivering master digital output signals and by a master input circuit, receiving slave digital output signals by way of this serial link. The slave element comprises, supplied by a slave electrical supply voltage, a slave input circuit receiving the master digital output signals by way of this serial link. A slave output circuit delivers the slave digital output signals and a slave module for regulating the electrical supply voltage of the slave input and output circuits is provided.

The slave module for regulating the electrical supply voltage comprises, on the one hand, a module for sampling and for detecting the peak value of the master digital output signals received by way of the serial link, this sampling and detecting module delivering a sampled peak value of the master digital output signals, and, on the other hand, a slaving module tracking the slave supply voltage of the slave input and output circuits to a value substantially equal to that of the sampled peak value of the master output signals. The slave module for regulating the electrical supply voltage makes it possible to deliver slave digital output signals whose peak amplitude is substantially matched to the peak amplitude of the master digital output signals.

The slaved supply and the slave module for regulating the supply voltage, which are the subjects of the present invention, find application to the embodying of electrical supply circuits of telecommunication equipment such as mobile or fixed telephones and their equipment microprocessor cards, in the form of CMOS type integrated circuits.

BRIEF DESCRIPTION OF THE DRAWINGS

The slave supply and the slave module for regulating the supply voltage, which are the subjects of the invention, will be better understood on reading the description and on looking at the drawings hereinbelow in which, apart from FIG. 1a and 1b which relate to the prior art:

FIG. 3b represents a timing diagram of the signals charted at the test points C, D and E of FIG. 2 and developed in synchronism with the signals charted at the test points A and B of FIG. 2, according to FIG. 3a;

MORE DETAILED DESCRIPTION

A more detailed description of the slaved supply for serial link of master/slave type and in particular of a slave module for regulating the electrical supply voltage of a slave element linked to a master element by a serial link, according to the invention, will now be given in conjunction with FIG. 2 and the following figures.

Figure 2:
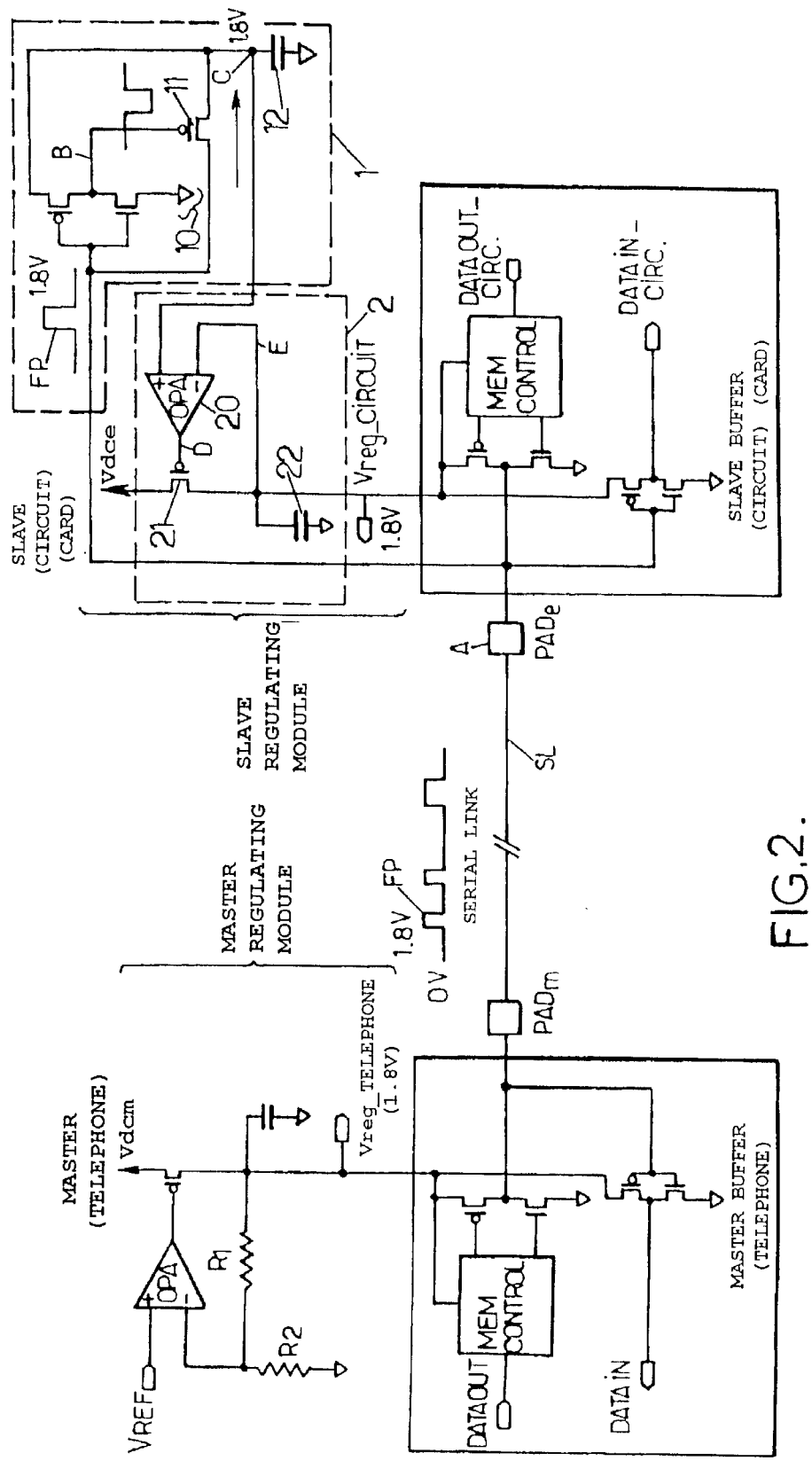
FIG. 2 represents, by way of illustration, a slave supply and a slave module for regulating the slave supply, which are the subjects of the present invention.

With reference to the aforesaid figure, it is indicated that a master element such as a mobile telephone for example or, as the case may be, a fixed telephone, is linked to a slave element by a serial link denoted SL in FIG. 2.

In a general manner, it is indicated that the master element, consisting of the telephone, comprises a master module for regulating the electrical supply voltage of a master output circuit, this master output circuit consisting of a master buffer circuit such as represented in FIG. 2. This master output circuit delivers master digital output signals while a master input circuit receives slave digital output signals, by way of the same serial link SL.

It is understood, of course, that the master element is supplied with electrical energy by a system for regulating electrical supply from a master supply voltage denoted Vdcm. More specifically and non-limitingly, it is indicated that the master element regulating device can advantageously correspond to that of the prior art such as described above in conjunction with FIG. 1a which, for this reason, will not be described in greater detail.

More specifically, the slave element comprises, supplied by a slave supply voltage denoted Vdce, a slave input circuit receiving the master digital output signals by way of the serial link SL and a slave output circuit delivering the slave digital output signals. The input circuit and the slave output circuit consist, as represented in FIG. 2, of a slave buffer, the slave element possibly corresponding to a telephone card such as a microprocessor card for example.

Generally, it is recalled that the master and slave buffer circuits each comprise a control buffer memory MEM CONTROL receiving the output data, denoted DATAOUT in respect of the master output data transmitted by way of an inverter to the master output terminal PAD, and a slave control memory receiving the output data of the constituent circuit or card of the slave element, these output data being denoted DATAOUT_circ. The slave control memory also delivers the slave digital output signals by way of an inverter to the output terminal PAD, the master respectively slave output terminals being linked by the serial link SL. Each master respectively slave buffer circuit furthermore comprises an inverter connected to the master respectively slave output terminals and making it possible to deliver the master respectively slave digital input signals denoted DATAIN respectively, DATAIN_circ.

Of course, the master respectively slave buffer circuits are supplied from the master Vdcm respectively slave Vdce supply voltage by way of a master respectively slave regulating module, which will be described hereinbelow.

Figure 1A:
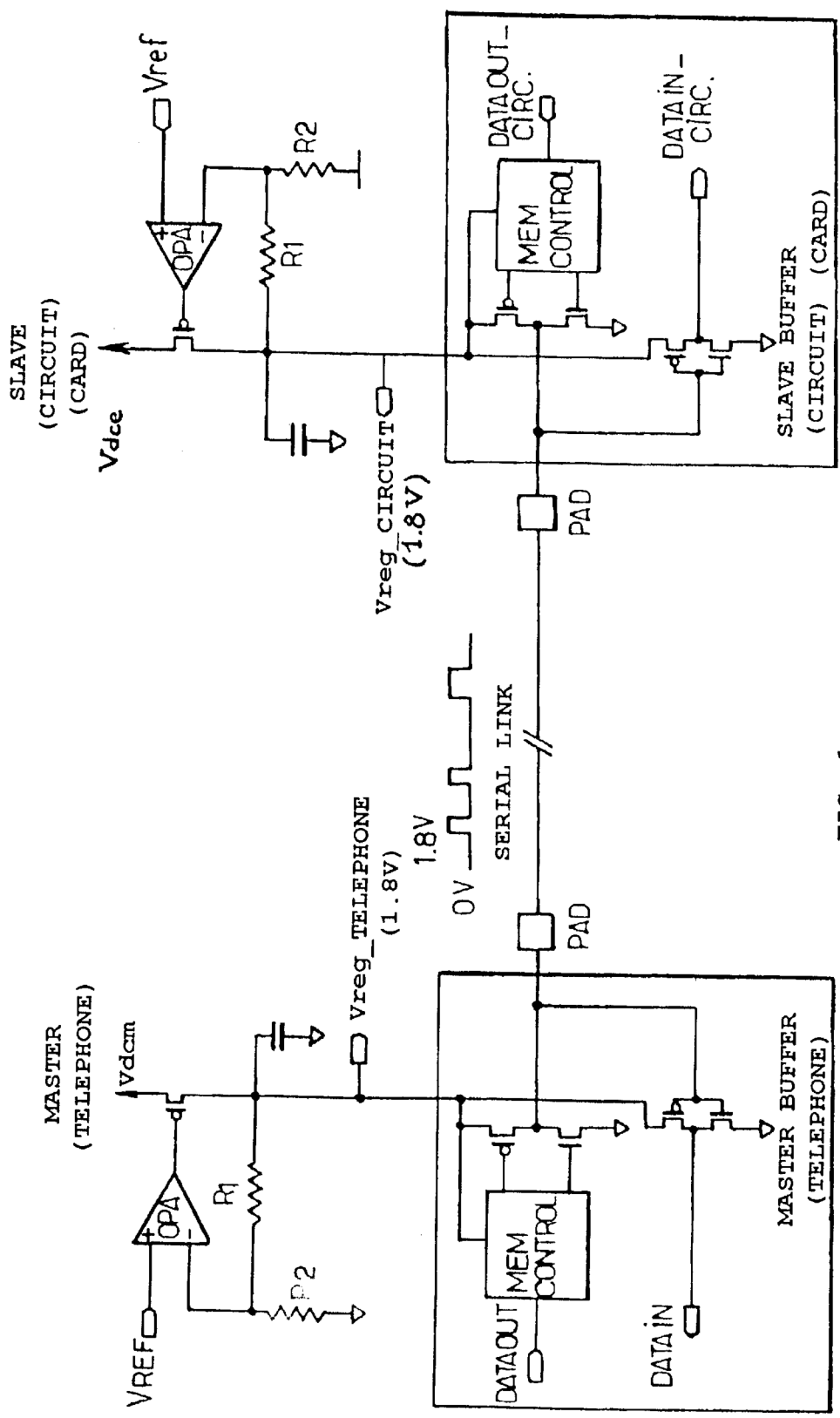
Figure 1B:
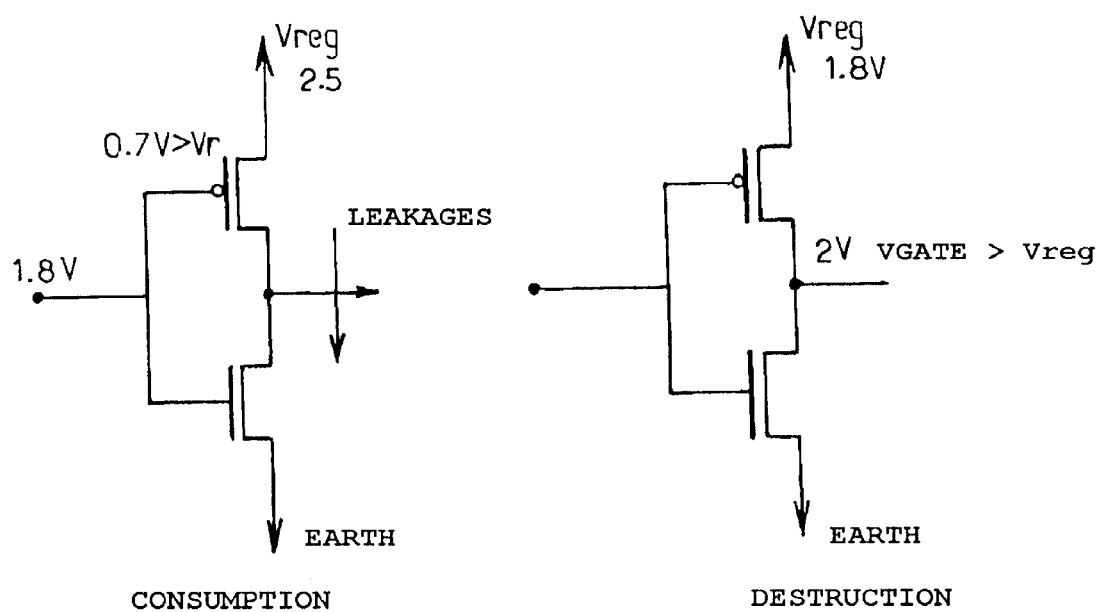

The master regulating module corresponds to the regulating module of the prior art described in conjunction with FIG. 1a and delivers a regulated master supply voltage denoted Vreg_telephone which, in the corresponding non-limiting exemplary application, is substantially equal to 1.8 volts. This voltage supplies, of course, the master buffer circuit.

In accordance with a particularly noteworthy aspect of the slaved supply that is the subject of the present invention, it is indicated that the slave module for regulating the electrical supply voltage of the slave buffer advantageously comprises a module 1 for sampling and for detecting the peak value of the master digital output signals received by way of the serial link SL. The sampling and detecting module 1 delivers a sampled peak value of the master digital output signals.

The slave regulating module furthermore comprises a tracking circuit 2 for slaving the slave supply voltage of the slave input and output circuits to a value substantially equal to that of the sampled peak value of the master output signals. In FIG. 2, the slave supply voltage allowing the supply to the slave buffer circuit is denoted Vreg_circuit. The slaving tracker circuit 2 makes it possible, by virtue of the supplying of the slave buffer circuit from the regulated slave supply voltage Vreg_circuit, to deliver slave digital output signals whose peak amplitude is substantially matched to that of the master digital output signals.

A preferred non-limiting embodiment of the various constituent elements of the slave regulating module represented in FIG. 2 will now be described in conjunction with the aforesaid figure.

As far as the module 1 for sampling and for detecting the peak value of the master digital output signals is concerned, these may advantageously comprise a detector circuit consisting of an inverter whose input is connected to the input of the slave input circuit, that is to say to the input terminal PADe, this detector circuit thus receiving the master digital output signals by way of the serial link SL. The detector circuit consisting of the inverter can be embodied in CMOS technology using two PMOS respectively NMOS transistors connected in a DRAIN source, source DRAIN serial connection and whose gate electrode, connected in parallel, is linked to the input terminal of the slave element PADe as is represented in FIG. 2.

Furthermore, the sampling and detecting module 1 comprises a circuit for storing the peak value of the master digital output signals, this circuit advantageously being formed by an interrupter circuit 11 consisting of a PMOS type transistor for example whose input is connected to the input of the slave circuit thus receiving master digital output signals and whose interrupt control terminal is connected at the output of the inverter which constitutes the detector circuit. Thus, the interrupt control terminal of the interrupter circuit 11 is controlled by the inverted master digital output signals delivered by the aforesaid inverter. The output terminal of the interrupter circuit 11 delivers sampled master digital output signals.

A storage and filtering capacitor is provided bearing the reference 12, this storage capacitor being connected between the output of the interrupter circuit 11 and the earth voltage of the slave element.

Furthermore, with reference to FIG. 2, the circuit 2 for slaving the slave supply voltage advantageously comprises a differential amplifier OPA, denoted 20, whose positive input terminal is connected to the peak value detection terminal of the storage capacitor 12 and whose negative terminal is connected to the supply terminal of the slave output circuit in fact delivering the regulated supply voltage Vreg_circuit of the slave buffer circuit, this regulated supply output voltage being taken as slaved supply voltage. The output terminal of the differential amplifier 20 delivers a control voltage with regard to the regulated supply voltage of the slave output circuit.

Furthermore, the slaving circuit 2 comprises a regulating transistor 21 whose input terminal is linked to the slave supply voltage Vdce and whose control terminal, that is to say the gate terminal, is linked to the output terminal of the differential amplifier 20. The control terminal of the transistor 21, that is to say its gate terminal, is thus controlled by the control voltage delivered by the differential amplifier 20, this control voltage thus making it possible to regulate the regulated supply voltage to the slave output circuit.

A capacitor for smoothing the regulated supply voltage of the slave output circuit, that is to say the voltage Vreg_circuit, is provided, this capacitor 22 being connected between the output terminal of the slaving circuit 2 delivering the regulated supply voltage of the slave output circuit Vreg_circuit and the earth voltage of the slave element.

The operation of the slave regulating module may be summarized in the manner below:
On the appearance of a pulse delivered by the serial link SL, in particular of a pulse train for waking up the slave element by the master element, immediately upon the appearance of the first pulse of amplitude 1.8 volts, this first pulse being denoted FP in FIG. 2, the inverter 10 constituting the detector circuit is triggered and the corresponding inverted master digital signal delivered at the output of the aforesaid inverter trips transistor 11 which constitutes the interrupter module so as to effect the sampling of the peak value of the aforesaid pulse. The interrupter transistor 11 being tripped into the on state, a charging current causes the storage capacitor 12 to charge to the peak amplitude value 1.8 volts of the first pulse FP. On the appearance of the stored peak voltage across the terminals of the capacitor 12, the differential amplifier 20 then causes, on the basis of this stored voltage taken as set-point value, the slaving of the value of the regulated supply voltage Vreg_circuit to the aforesaid set-point value by way of the regulating transistor 21, which, controlled by the output of the differential amplifier 20, plays the role of a voltage-controlled adjustable resistor making it possible to effect the slaving of the value of the aforesaid regulated supply voltage delivered by the slaving circuit 2 to the set-point value, that is to say to the value stored by the capacitor 12.

When the first pulse FP disappears, the interrupter consisting of the transistor 11 is then restored to the off state and the peak voltage value stored at the capacitor 12 is maintained, the value of the regulated supply voltage Vreg_circuit delivered by the slaving circuit 2 being maintained, under these conditions, at the earlier peak amplitude value. of course, on the appearance of a new pulse, the process is repeated, thereby making it possible to ensure tracking of the slave regulated supply voltage delivered to the slave buffer circuit, and in particular to the slave output circuit, to the exact value of the peak amplitude of the constituent pulses of the master digital signals received on the input terminal PADe of the slave element.

Figure 3A:
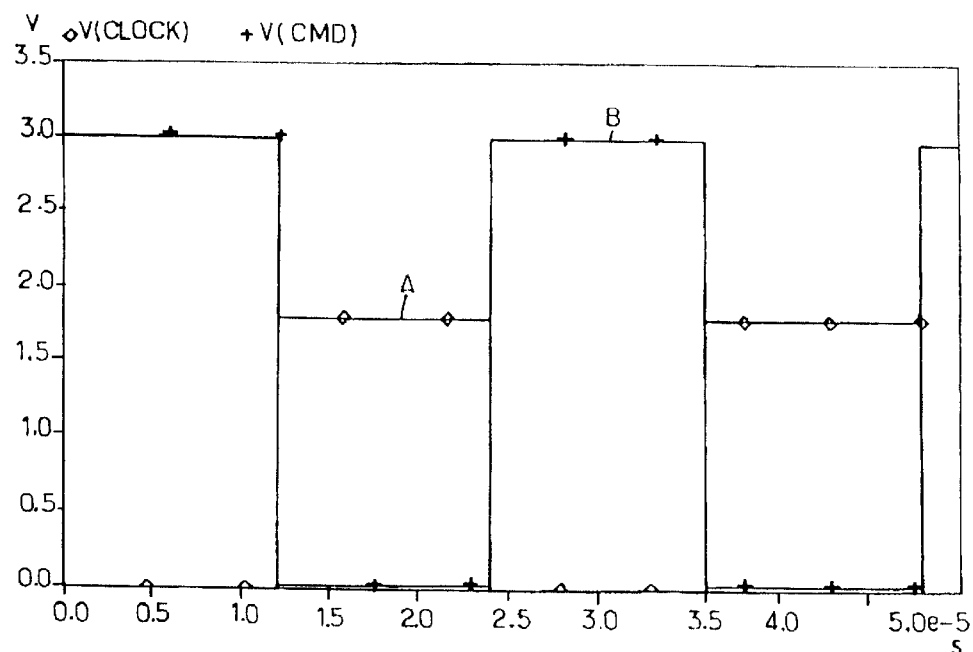
FIG. 3a represents a timing diagram of the signals charted at the test points A and B of FIG. 2 and illustrating the digital signals respectively the inverted master digital signals.
Figure 3B:
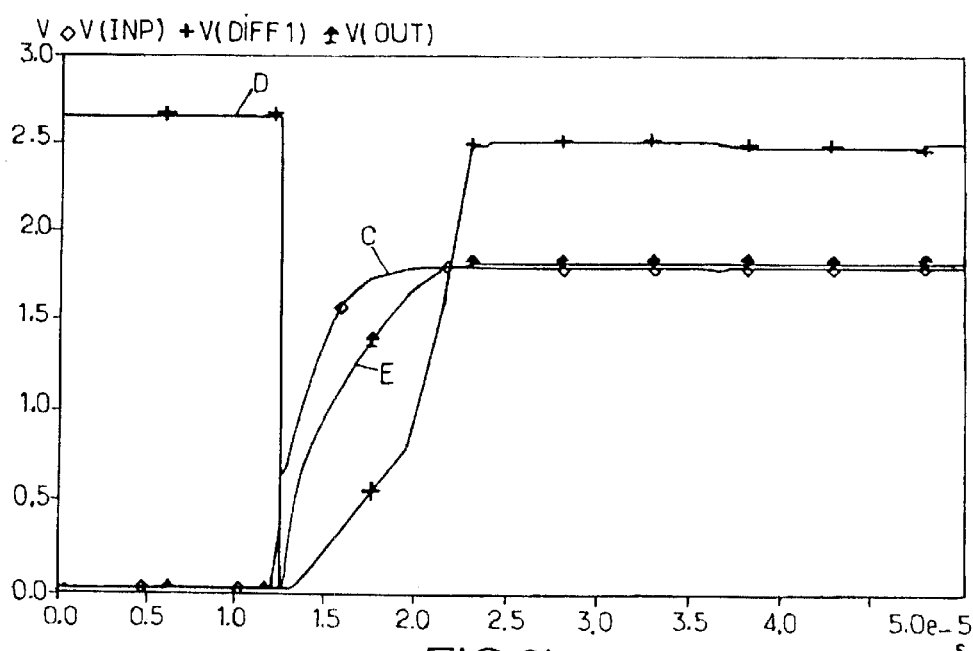

Specific timing diagrams, charted at the test points A, B, C, D, E of FIG. 2, are represented in FIGS. 3a, 3b respectively 3c.

In respect of the aforesaid figures, it is indicated with reference to FIG. 2 that the test point A is the test point corresponding to the input terminal of the serial link SL of the slave element, that is to say the terminal PADe:

the test point B corresponds to the output point of the inverter 10 which constitutes the detector circuit delivering the inverted master digital signals;

the test point C corresponds to the terminal of the storage capacitor 12 receiving the stored peak amplitude value and delivering this value to the positive terminal of the differential amplifier 20;

the test point D corresponds to the output terminal of the operational amplifier 20 linked to the control terminal of the regulating transistor 21;

the test point E corresponds to the output terminal of the slaving circuit 2 delivering the regulated supply voltage Vreg_circuit as well as to the voltage applied to the negative terminal of the differential amplifier 20.

Represented in FIG. 3a are respectively a signal corresponding to the first pulse FP charted at the test point A representative of the input master digital signals and of the inverted master digital signals charted at the test point B and delivered by the output of the inverter 10.

Represented in FIG. 3b in chronological correspondence with the signals represented in FIG. 3a are:

the peak voltage stored by the storage capacitor 12 at the test point C;

the voltage delivered by the output of the differential amplifier 20 at the test point D, that is to say on the gate terminal of a regulating transistor 21;

the slave regulated supply voltage, that is to say the voltage Vreg_circuit delivered by the output of the slaving circuit 2 at the test point E.

In FIGS. 3a and 3b, the abscissa axis is graduated in tens of microseconds and the ordinate axis in volts.

Figure 3C:
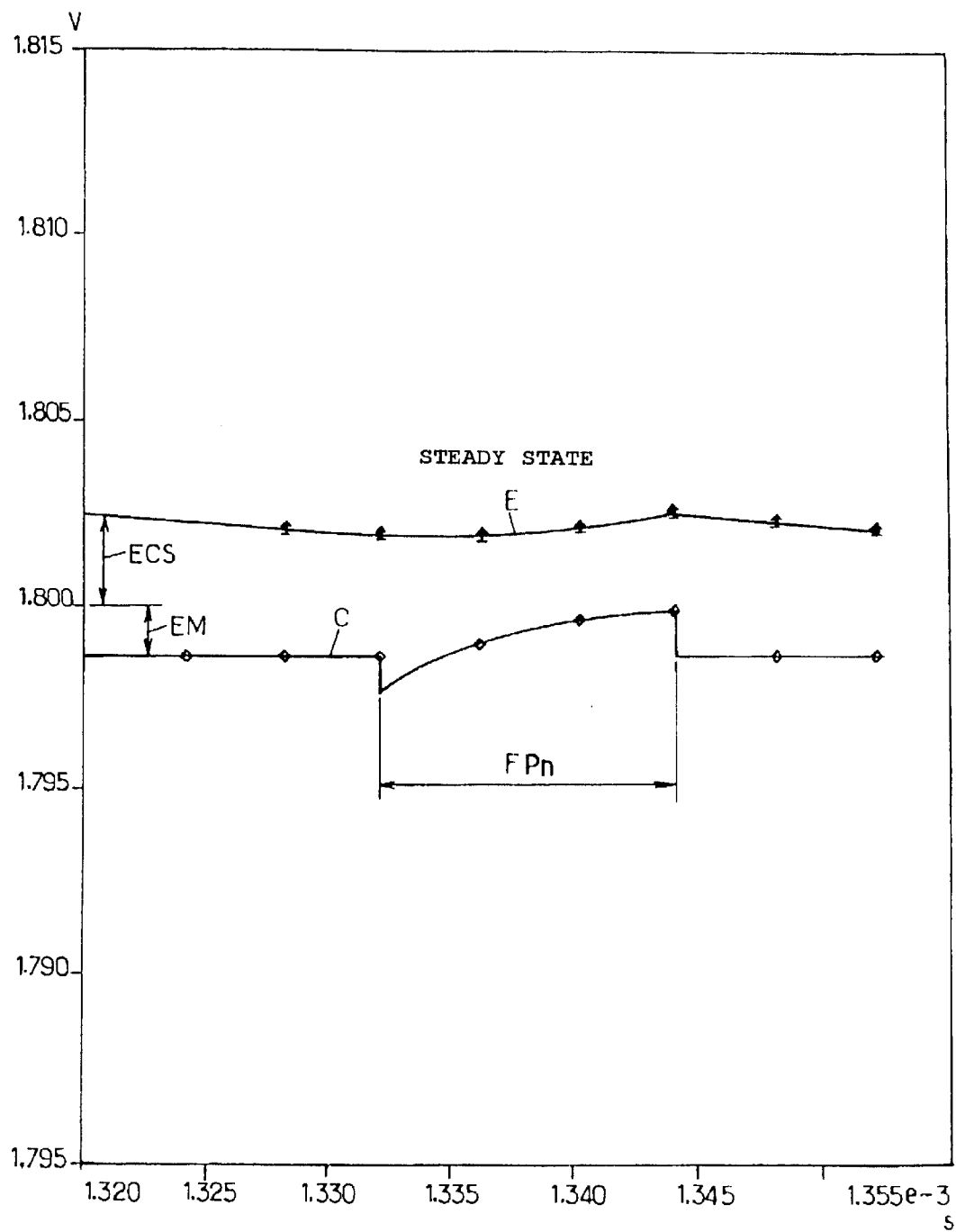
FIG. 3c represents an amplitude-expanded view of the signals charted at the test points C and E of FIG. 2, this expanded view making it possible to reveal amplitude-slaving errors not exceeding 3 mV.

Represented in FIG. 3c on an expanded scale along the ordinate axis, that is to say the amplitude axis, respectively on a contracted scale along the abscissa axis or time scale are, on the one hand, the signal available at the terminals of the storage capacitor 12, that is to say on the positive terminal of the differential amplifier 20 at the test point C and the slave regulated supply voltage, that is to say the voltage Vreg_circuit, available at the test point E, on the other hand.

The aforesaid two voltages are represented with reference to the first pulse $FP_1$ of the signal available on the serial link SL for FIGS. 3a and 3b and to a pulse $FP_n$ of rank n in the steady state in FIG. 3c.

On looking at FIG. 3c, it may be observed, on the one hand, that for a master regulated supply voltage equal to 1.8 volts based for example on a reference voltage of 1.25 volts delivered by a "bandgap" type circuit, the storage error EM at the test point C, with respect to the aforesaid value of 1.8 volts, does not exceed 1.5 millivolts in the steady state, whereas on the appearance of the first pulse $FP_1$ or eventually of a subsequent pulse $FP_n$ on the serial link SL, the amplitude of variation of the voltage stored across the terminals of the capacitor 12 and eventually applied to the positive terminal of the differential amplifier 20 does not exceed ±1.5 millivolts, thereby making it possible to ensure a dynamic precision of the stored peak amplitude not exceeding 2/1000.

In the same way, looking at FIG. 3c shows that the slave regulated supply voltage, that is to say the voltage Vreg__ circuit exhibits, in the steady state, a mean error ECS due to the error introduced by the tracker circuit (consisting of the slaving circuit 2) not exceeding 3 millivolts.

What is claimed is:

1. Slaved supply for linking a slave element linked to a master element by a serial link, the master element comprising a master module for regulating the electrical supply voltage of a master output circuit, delivering master digital output signals, and of a master input circuit, receiving slave digital output signals by way of said serial link, the slave element comprising, supplied by a slave electrical supply voltage, a slave input circuit receiving the master digital output signals by way of said serial link, a slave output circuit delivering the slave digital output signals and a slave module for regulating the electrical supply voltage of the slave input and output circuits, wherein said slave module for regulating the electrical supply voltage comprises:

means for sampling and for detecting the peak value of said master digital output signals received by way of said serial link, said sampling and detecting means delivering a sampled peak value of said master digital output signals;

means for slaving said slave supply voltage of said slave input and output circuits to a value substantially equal to that of the sampled peak value of said master output signals, thereby making it possible to deliver slave digital output signals whose peak amplitude is substantially matched to the peak amplitude of the master digital output signals.

2. Slaved supply according to claim 1, wherein said means for sampling and for detecting the peak value of the master digital output signals comprise at least:

a detector circuit, whose input is connected to the input of the slave input circuit receiving the master digital output signals by way of said serial link and whose output delivers inverted master digital output signals;

a circuit for storing the peak value of the master digital output signals and comprising:

an interrupter module whose input is connected to the input of the slave circuit receiving the master digital output signals, whose interrupt control terminal is connected at the output of said inverter circuit and controlled by said inverted master digital output signals and whose output terminal delivers sampled master digital output signals, and a peak value storage capacitor connected between the output of said interrupter module and the earth voltage.

3. Slaved supply according to claim 2, wherein said means for slaving said slave supply voltage comprise:

a differential amplifier whose positive input terminal is connected to the peak value detection terminal of said storage capacitor, whose negative terminal is connected to the supply terminal of said slave output circuit delivering a regulated supply voltage of the slave circuit taken as slaved supply voltage and whose output delivers a control voltage with regard to the regulated supply voltage of the slave output circuit;

a regulating transistor whose input terminal is linked to the slave supply voltage, whose control terminal is linked to the output terminal of the differential amplifier and controlled by said control voltage with regard to the regulated supply voltage of the slave output circuit, said regulating transistor delivering, to said slave output circuit, said regulated supply voltage of the slave output circuit, slaved to the peak value of the master digital output signals.

* * * * *